United States Patent [19]
Baba

[11] Patent Number: 5,687,203
[45] Date of Patent: Nov. 11, 1997

[54] DIGITAL PHASE LOCKED LOOP CIRCUIT

[75] Inventor: Mitsuo Baba, Tokyo, Japan

[73] Assignee: NEC Corporation, Tokyo, Japan

[21] Appl. No.: 608,818

[22] Filed: Feb. 29, 1996

[30] Foreign Application Priority Data

Mar. 1, 1995 [JP] Japan .................. 7-041132

[51] Int. Cl.$^6$ .................................................. H03D 3/24
[52] U.S. Cl. .................................. 375/376; 375/375
[58] Field of Search ........................... 375/371, 373,
375/355, 375, 376; 331/1, 7, 9, 17, 36,
41, 43, 44, 45, 46

[56] References Cited

U.S. PATENT DOCUMENTS

| | | | |
|---|---|---|---|
| 4,841,551 | 6/1989 | Avaneas | 375/371 |
| 4,972,444 | 11/1990 | Melrose et al. | 375/373 |
| 5,034,967 | 7/1991 | Cox et al. | 375/371 |
| 5,259,005 | 11/1993 | LaRosa et al. | 375/355 |
| 5,272,391 | 12/1993 | Ampe et al. | 375/371 |
| 5,349,613 | 9/1994 | Dijkhof | 375/371 |
| 5,371,766 | 12/1994 | Gersbach et al. | 375/373 |

Primary Examiner—Stephen Chin
Assistant Examiner—Joseph Roundtree
Attorney, Agent, or Firm—Scully, Scott, Murphy & Presser

[57] ABSTRACT

A digital PLL circuit has a data sampling circuit for sampling input data in response to N phase clocks in the direction of time. The phase of the clock corresponding to, among the sampled data, the data in which edges are evenly detected is used as a first phase or reference clock. The successive clocks following the first phase clock are used as a second phase clock to an N-th phase clock. The sampled data are rearranged in synchronism with the first phase clock to the N-th phase clock to turn out first phase to N-th phase sampled data. The first phase to the N-th phase sampled data are latched by the first phase clock. The pattern of data received in bursts is identified every period on the basis of the latched first to N-th phase data. Among the latched first to N-th sampled data, the data to be identified are selected. These data are retimed in synchronism with the first phase clock so as to output a phase clock signal.

6 Claims, 18 Drawing Sheets

| INPUT SIGNAL | | | | | | | | OUTPUT SIGNAL 107 | PHASE NO. |
|---|---|---|---|---|---|---|---|---|---|
| 1 | 2 | 3 | 4 | 5 | 6 | 7 | 8 | | |
| 0 | X | X | X | X | X | X | X | 0 (000) | 1 |
| 1 | 0 | X | X | X | X | X | X | 1 (001) | 2 |
| 1 | 1 | 0 | X | X | X | X | X | 2 (010) | 3 |
| 1 | 1 | 1 | 0 | X | X | X | X | 3 (011) | 4 |
| 1 | 1 | 1 | 1 | 0 | X | X | X | -4 (100) | 5 |
| 1 | 1 | 1 | 1 | 1 | 0 | X | X | -3 (101) | 6 |
| 1 | 1 | 1 | 1 | 1 | 1 | 0 | X | -2 (110) | 7 |
| 1 | 1 | 1 | 1 | 1 | 1 | 1 | 0 | -1 (111) | 8 |
| 1 | 1 | 1 | 1 | 1 | 1 | 1 | 1 | 0 (000) | 1 |

(X : Don't care)

FIG.8

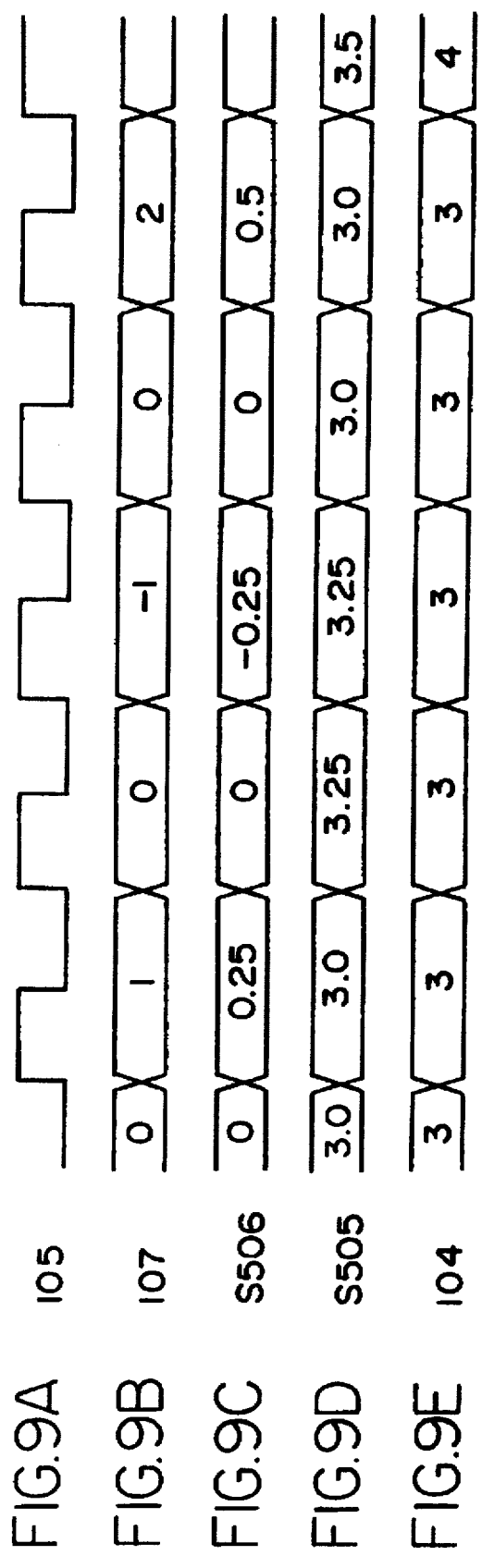

DIGITAL PHASE LOCKED LOOP CIRCUIT

BACKGROUND OF THE INVENTION

The present invention relates to a digital phase locked loop (PLL) circuit and, more particularly, to a digital PLL circuit advantageously applicable to a receiver included in an optical communication system which receives a data signal in bursts containing much jitter.

A typical PLL circuit includes a phase comparator for comparing the phase of an input data signal and that of the output of a voltage controlled oscillator (VCO) so as to generate an error signal. A low-pass filter (LPF) removes high frequency components from the error signal and feeds the resulting signal to the VCO. The VCO whose output is controlled by the filter output produces an output signal phase-locked to the input data signal.

The above PLL circuit causes the LPF to remove high frequency components from the error signal, i.e., to smooth it, controls the oscillation frequency of the VCO with the smoothed signal, and thereby tunes the frequency to the input data. Hence, when data are received in the form of bursts noticeably varying in phase due to frequency deviation, duty variation, jitter and so forth, the PLL circuit needs a long phase tuning time and brings about errors when retiming the received data on the basis of a separated clock.

SUMMARY OF THE INVENTION

It is therefore an object of the present invention to provide a digital PLL circuit capable of rapidly producing a separated clock phase-locked to received burst data involving frequency variation, duty variation, jitter, etc.

A digital PLL circuit of the present invention has a clock separating circuit for separating one of N phase clocks, which are identical in frequency with a burst data signal and sequentially shifted in phase by 360 degrees/N (N being 2 or greater integer), at a time in response to a separate signal indicative of which of the N phase clocks should be separated. A sampling circuit samples the burst data signal in response to the N phase clocks to thereby generate N sampled data. A rearranging circuit rearranges, by using the clock indicated by the separate signal as a reference first clock and using the successive clocks as a second phase clock to an N-th phase clock, the N sampled data in response to the first clock to the N-th clock to thereby output a first phase sampled data to an N-th phase sampled data. A latching circuit latches the first sampled data to the N-th sampled data in response to the reference first phase clock separated. An edge detecting circuit detects, based on levels of nearby phases output from the latching circuit, a position of the phase where a negative-going edge exists to thereby generate negative-going edge position information every period of the clock, and foe detecting the number of negative-going edges and the number of positive-going edges to thereby generate negative-going edge number information and positive-going edge number information every period of the clock. A calculating circuit calculates a mean value of the negative-going edge position information from the past to the present every period to thereby output the separate signal. A data selecting circuit selects one of the first phase sampled data to the N-th phase sampled data at a time every period on the basis of the first phase sampled data to the N-th phase sampled data and the negative-going edge number information and positive-going edge number information. A retiming circuit retimes the outputs of the data selecting circuit in synchronism with the first phase clock.

The data selecting circuit has a circuit for detecting the phase of, among the first phase sampled data to the N-th phase sampled data, the sampled data in which an edge occurs first within one period, and a selector for selecting, when the negative-going edge number information and positive-going edge number information are both representative of 0 (zero) or when only the negative-going edge number information or only the positive-going edge number information is representative of 1 (one), the sampled data corresponding to the phase clock shifted substantially 180 degrees in phase relative to the reference first clock, or selecting, when the negative-going edge number information and positive-going edge number information are both representative of 1, the sampled data in which an edge has been detected first within the one period.

With the above configuration, the digital PLL circuit produces a mean position where the positive-going edges appear and a mean position where the negative-going edges appear individually. Further, the PLL circuit samples the data in the direction of time by use of multiphase clocks and retimes the data after data identification on the basis of the number of data edges. Hence, the PLL circuit is capable of outputting, on receiving burst data whose phase varies due to frequency deviation, duty fluctuation, jitter and so forth, a separated clock following the data in a short period of time corresponding to only several bits. In addition, the PLL circuit can output data identified and retimed without any error.

BRIEF DESCRIPTION OF THE DRAWINGS

The above and other objects, features and advantages of the present invention will become apparent from the following detailed description taken with the accompanying drawings in which:

FIG. 8 shows a coding logic applicable to coders included in the edge detecting circuit;

FIGS. 9A–9E are timing charts representative of a specific operation of the negative-going edge counter;

DETAILED DESCRIPTION OF THE PREFERRED EMBODIMENT

Figure 1:
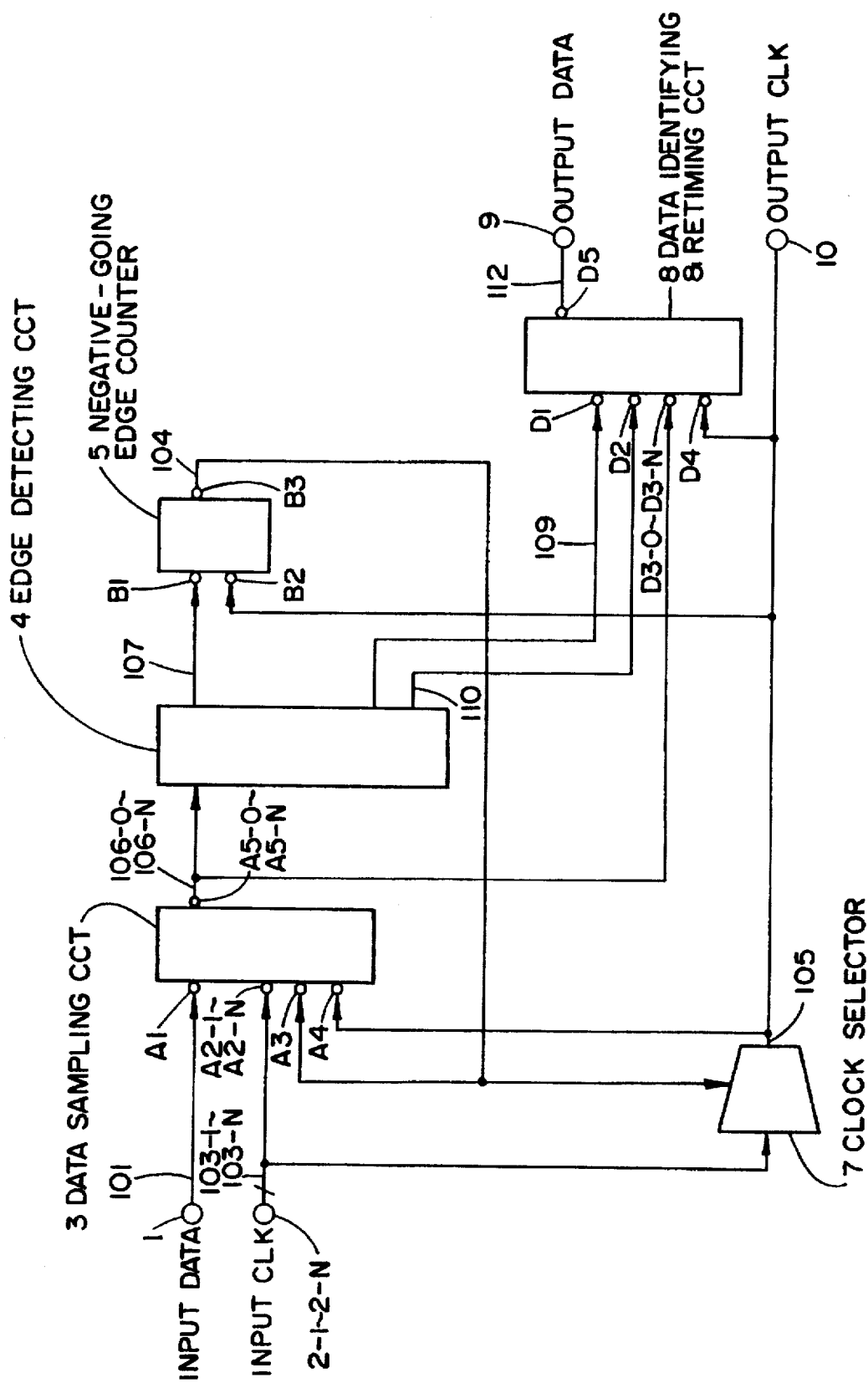
FIG. 1 is a block diagram schematically showing a digital PLL circuit embodying the present invention.
Figure 6:
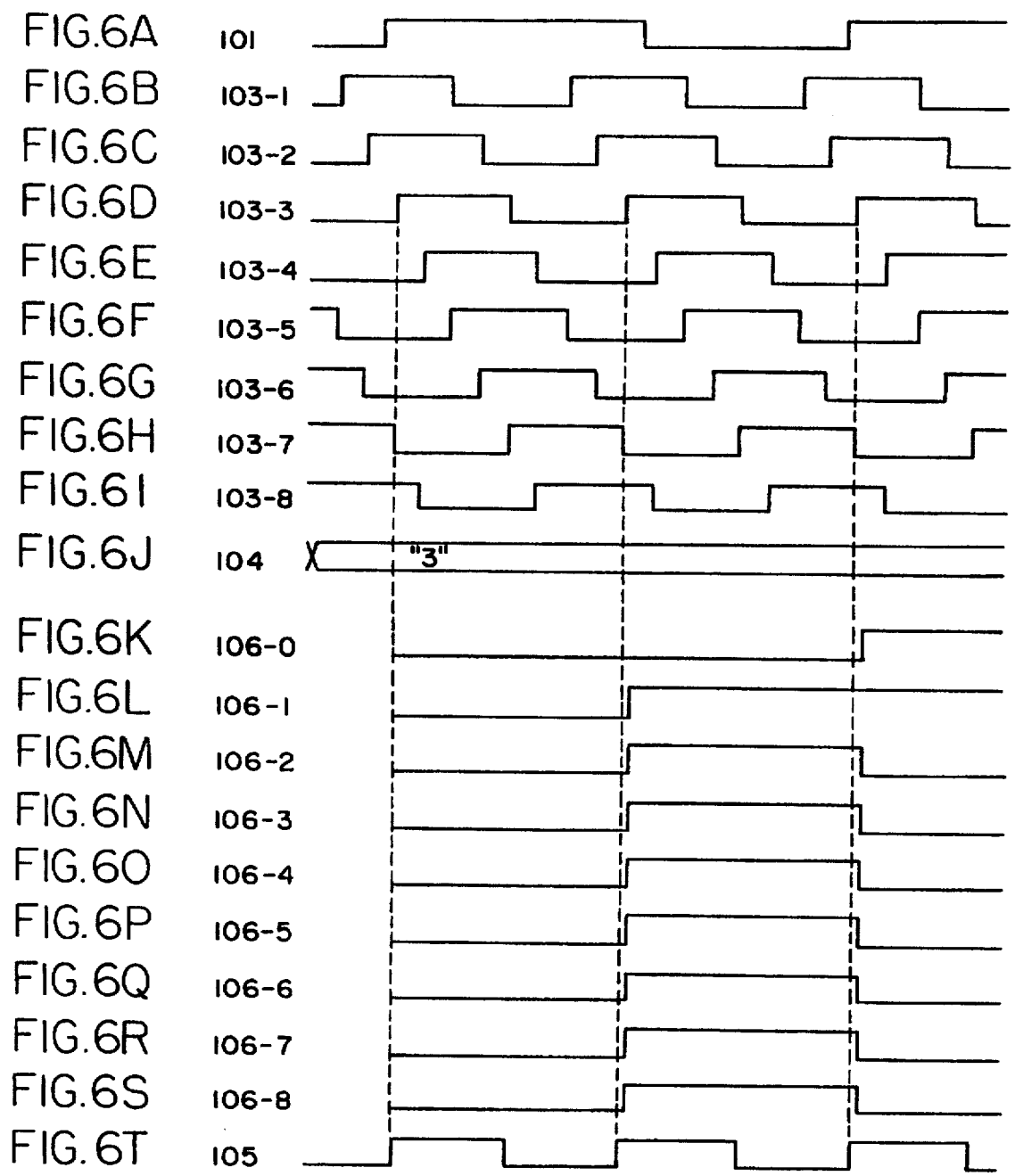
FIGS. 6A–6T are timing charts demonstrating a specific operation of the data sampling circuit.
Figure 7:
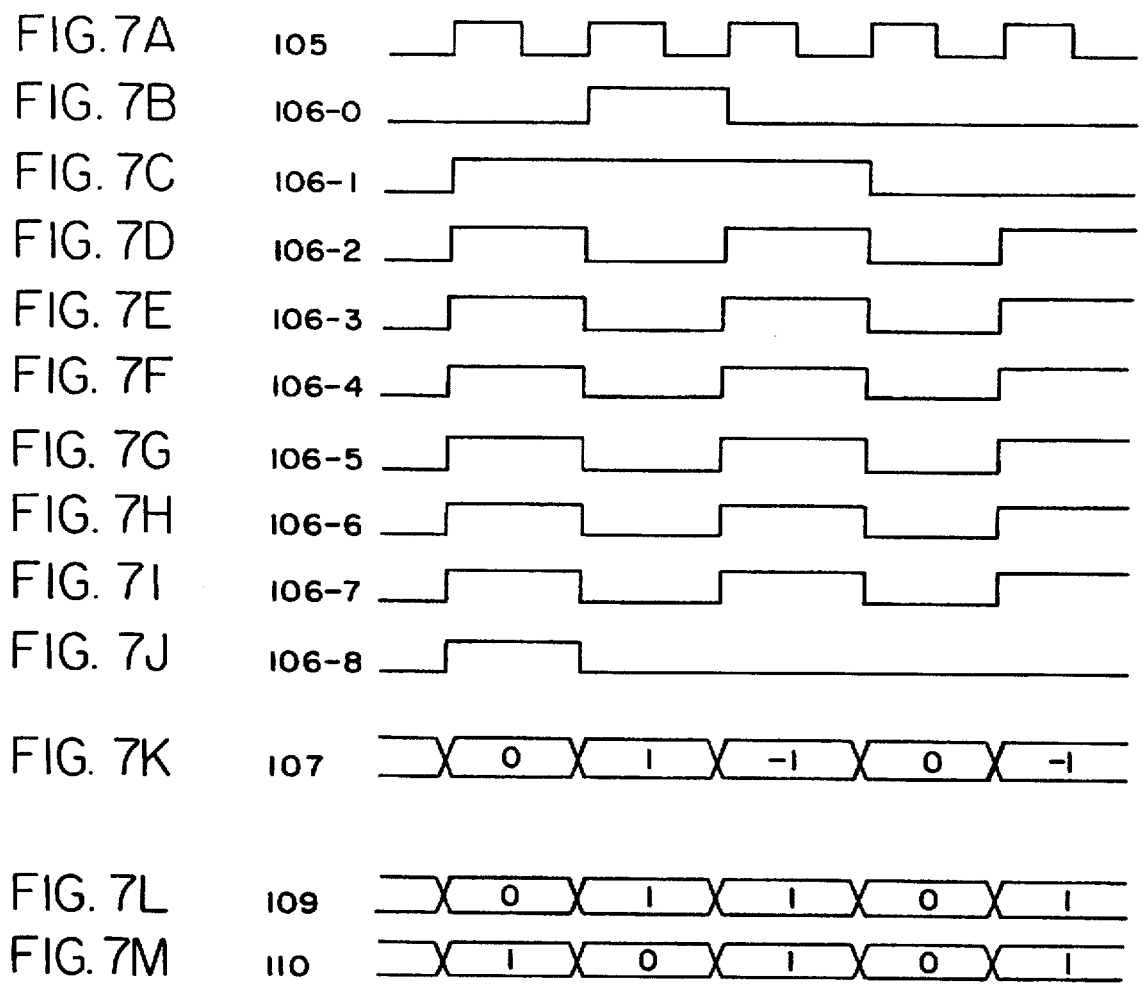
FIGS. 7A–7M are timing charts demonstrating a specific operation of the edge detecting circuit.

Referring to FIG. 1 of the drawings, a digital PLL embodying the present invention is shown. As shown, data 101 received in bursts are input to a data sampling circuit 3 via an input terminal 1. N (N being 2 or greater integer) phase clocks 103-1 to 103-N are also applied to the data sampling circuit 3 via N phase clock input terminals 2-1 to 2-N, respectively. As shown in FIG. 6 specifically, the N phase clocks 103-1 to 103-N are identical in frequency with the input data 101, but the phases of the clocks are sequentially shifted by 360 degrees/N.

The data sampling circuit 3 samples the input data 101 by using the clocks 103-1 to 103-N, and retimes the N sampled data in synchronism with a clock 105 selected by a clock selector 7 which will be described. Further, the circuit 3 regards the clock 105 as a first or reference phase clock and regards the clocks 103-1 to 103-N as a second phase clock to an N-th phase clock, respectively. The circuit 3 rearranges (rotates) the N samples data in accordance with the first to N-th phase clocks, and then outputs them (106-1 to 106-N). Labeled 106-0 in FIG. 6 is sampled data for reference.

An edge detecting circuit 4 detects edges on the basis of the N sampled data undergone rotation (retimed on the basis of the first phase or reference clock). Specifically, the circuit 4 outputs, every period, edge position information 107 consisting of the number 109 of negative-going edges, the number 110 of positive-going edges, and the position of negative-going edges (phase number).

A negative-going edge counter 5 receives the edge position information 107 and produces a mean value 104 of the past negative-going phase number to the present negative-going phase number. The mean value 104 is the phase number of the previously mentioned first or reference phase clock. The mean value 104 is fed to the clock selector 7 as the previously mentioned clock select signal. In addition, the mean value 104 is applied to the data sampling circuit 3 as a phase number representative a reference for rotation.

A data identifying and retiming circuit 8 retimes, in response to the first or reference phase clock selected by the clock selector 7, one of the N sampled data 106-1 to 106-N fed from the data sampling circuit 3, and outputs it (112). To select one of the sampled data 106-1 to 106-N to be retimed, the circuit 8 recognizes the pattern of the received data by referencing the number of positive-going edges 110 and all of the N sampled data 106-1 to 106-N, and uses the recognized pattern for the selection.

Figure 2:
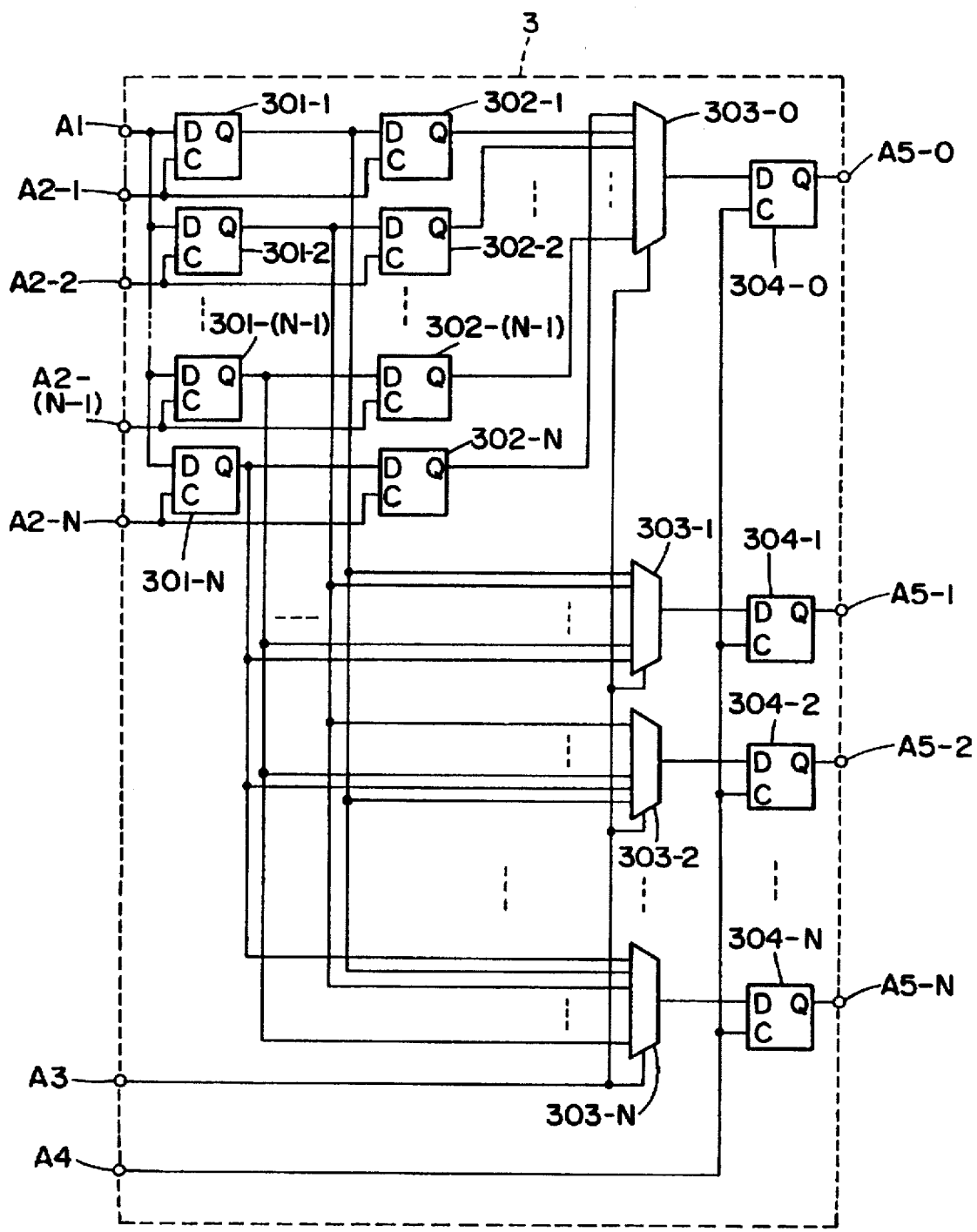
FIG. 2 shows a specific configuration of a data sampling circuit included in the embodiment.

FIG. 2 shows a specific construction of the data sampling circuit 3. As shown, the data signal input to an input terminal A1 is applied to the data terminals of flip-flops (F/Fs) 301-1 to 301-N. The N phase clock signals are respectively input to terminals A2-1 to A2-N and therefrom to the clock terminals of the F/Fs 301-1 to 301-N and the clock terminals of F/Fs 302-1 to 302-N.

The outputs of the F/Fs 301-1 to 301-N are fed to the data terminals of the F/Fs 302-1 to 302-N, respectively. At the same time, the outputs of the F/Fs 301-1 to 301-N are applied to the input terminals of selectors 303-1 to 303-N while being sequentially shifted by one phase. The selectors 303-1 to 303-N each selects and outputs one of the N inputs, as indicated by a selection control signal.

The outputs of the F/Fs 302-1 to 302-N, are applied to a selector 303-0 in the order of N, 1, 2, 3, . . . , N-1. The selector 303-0 selects one of the N inputs, as indicated by the selection control signal input thereto via a terminal A3.

The outputs of the selectors 303-0 to 303-N are respectively fed to the data terminals of F/Fs 304-0 to 304-N which are clocked by the separated clock signal input via a terminal A4. The sampled data produced by the F/Fs 304-0 to 304-N are output via terminals A5-0 to A5-N, respectively.

Figure 3:
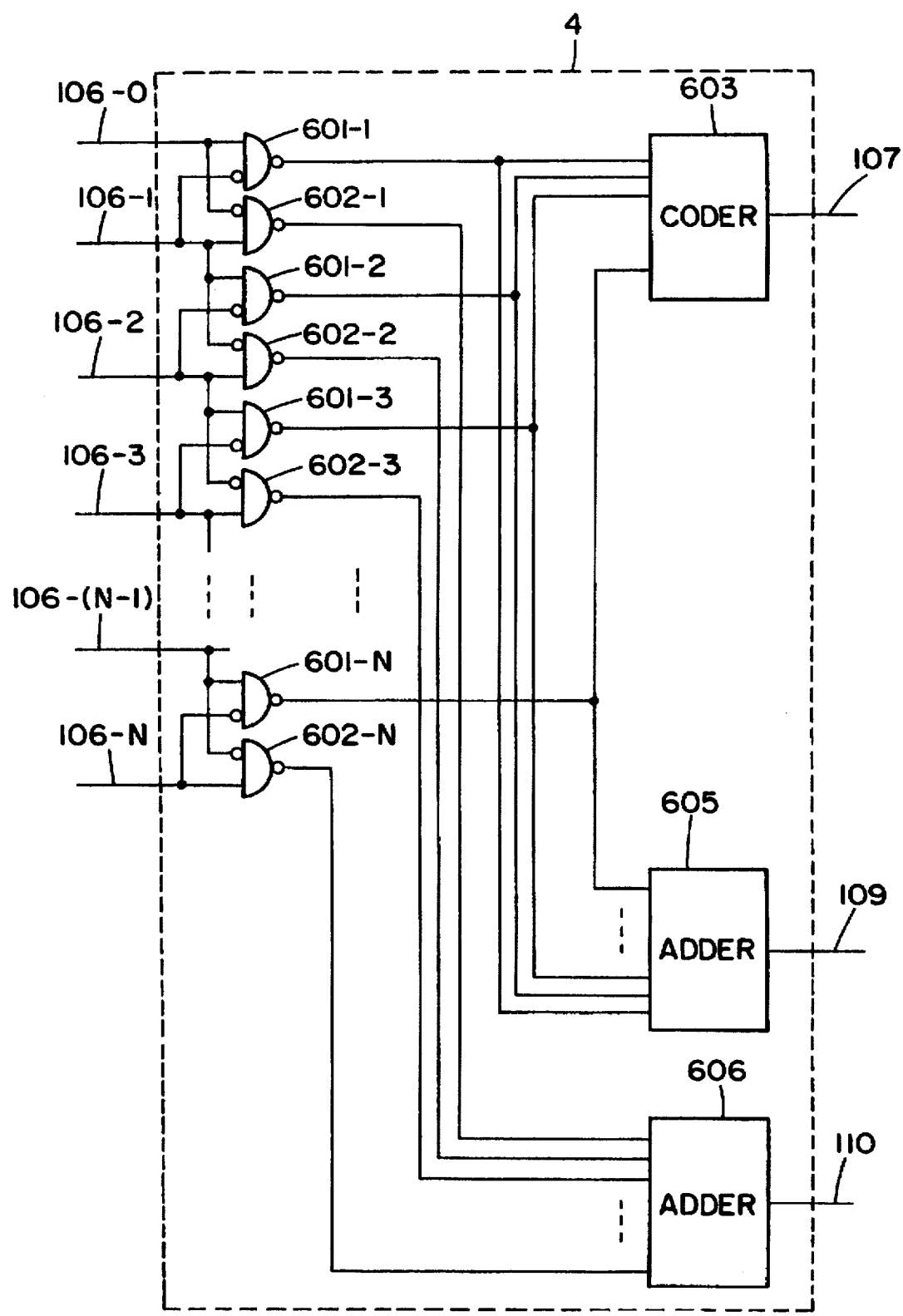
FIG. 3 shows a specific configuration of an edge detecting circuit also included in the embodiment.

FIG. 3 shows a specific configuration of the edge detecting circuit 4. As shown, the sampled data 106-0 to 106-(N-1) and the logically inverted data of the sampled data 106-1 to 106-N are applied to first NAND gates 601-1 to 601-N, as illustrated.

The logical inverted data of the sampled data 106-0 to 106-(N-1) and the sampled data 106-1 to 106-N are applied to second NAND gates 602-1 to 602-N, as illustrated.

The outputs of the first NAND gates 601 to 601-N are applied to a coder 603 and an adder 605 while the outputs of the second NAND gates 602-1 to 602-N are applied to an adder 606.

The coder 603 codes the positions where a negative-going edge exists ("0" and representative of the phase number), thereby outputting the negative-going edge information signal 107.

The adder 605 counts the negative-going edges ("0") and outputs a signal 109 representative of the number of negative-going edges. The adder 606 counts the positive-going edges ("1") and outputs a signal 110 representative of the number of positive-going edges.

Figure 4:
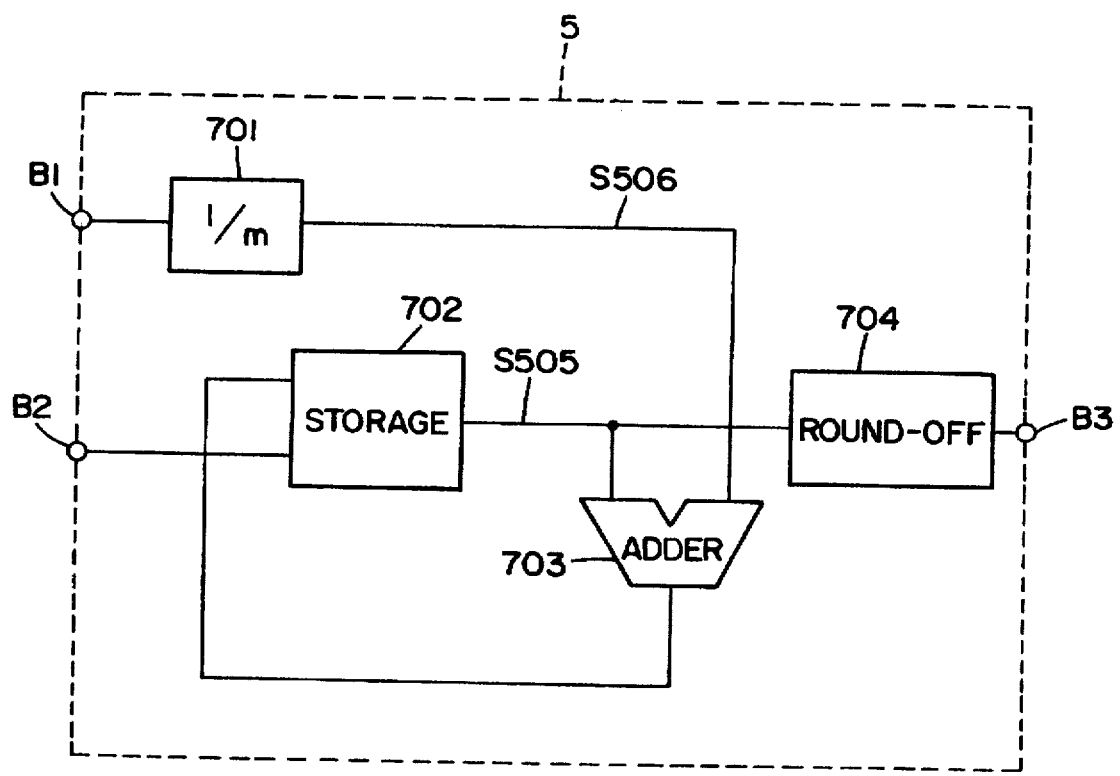
FIG. 4 shows a specific configuration of a negative-going edge counter further included in the embodiment.

FIG. 4 shows a specific configuration of the negative-going edge counter 5 shown in FIG. 1. As shown, the edge position information 107 is input to a 1/m (m being 1 or greater integer) weighting section 701 via a terminal B1.

The separated clock is input to a storage 702 via a terminal B2 as a clock. The storage 702 holds the output of an adder 703 while feeding it to a round-off circuit 704. The adder 703 adds the output of the 1/m weighting section 701 and the output of the storage 702 and feeds the corrected mean value to the storage 703.

The round-off circuit 704 rounds the output of the storage 702 to an integer and delivers the rounded value as the mean signal.

Figure 5:
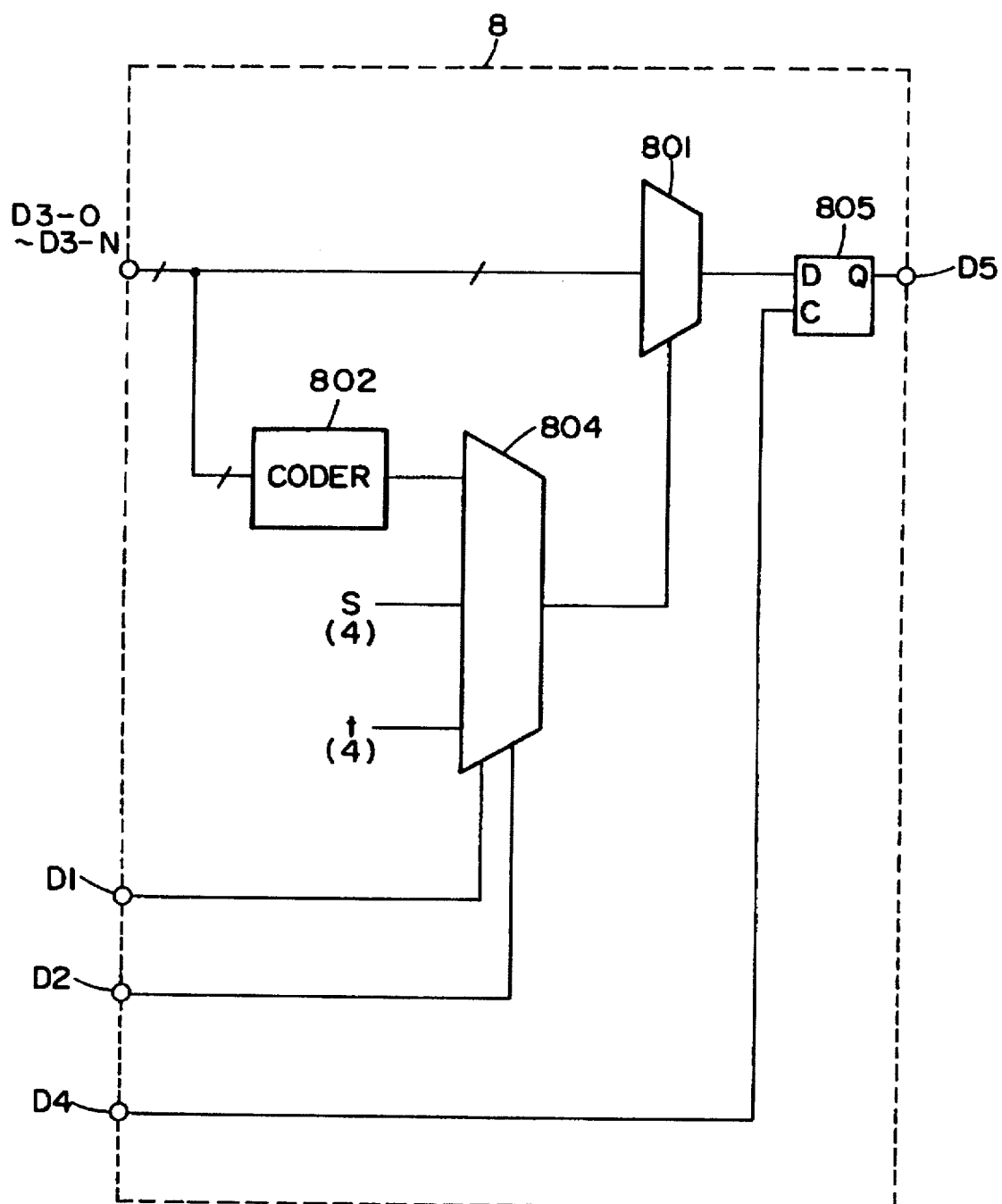
FIG. 5 shows a specific configuration of a data identifying and retiming circuit additionally included in the embodiment.

FIG. 5 shows a specific configuration of the data identifying and retiming circuit 8 shown in FIG. 1. As shown, the sampled data signals are input to a coder 802 via terminals D3-0 to D3-N. The sampled data applied to the terminals D3-1 to D3-N are also applied to a selector 801. The selector 801 selects and outputs one of the N inputs which is designated by the selection control signal.

The coder 802 codes the first edge position included in the sampled data signals, The coder 802 is identical with the coder 603 shown in FIG. 3.

A selector 804 receives the output of the coder 802 and representative of the first edge position, s (integer greater than 1 inclusive, but smaller than N inclusive), and t (integer greater than 1 inclusive, but smaller than N inclusive). The selector 804 selects one of the three inputs, as indicated by the selection control signal.

Specifically, the signal representative of the number of negative-going edges and the signal representative of the number of positive-going edges are input to the selection control terminals of the selector 804 via terminals D1 and D2, respectively. The selector 804 selects and outputs s if only the number of negative-going edges is one, selects and outputs t if only the number of positive-going edges is one, or selects the output of the coder 802 if both the number of negative-going edges and that of positive-going edges are one (meaning two data edges).

The selector 801 selects and outputs the sampled data designated by the output of the selector 804. An F/F 805 retimes the output of the selector 801 in synchronism with the separated clock signal and outputs it as retimed data Via a terminal D5.

The clock selector 7, FIG. 1, selects the separated clock 105 out of the N phase clocks 103-1 to 103-N, as indicated by the negative-going mean signal or selection control signal 104.

A specific operation of the illustrative embodiment will be described with reference to FIG. 6. Assume that the N phase clocks are eight phase clock (N=8), that the 1/m weighting section 701 is a ¼ weighting section (m=4), and s and t shown in FIG. 5 are both 4. FIGS. 6A-T show the separated clock 105 and the variations of the sampled data 106-0 to 106-8 to occur when the eight phase clocks 103-1 to 103-8 are input.

Assume that the negative-going edge mean signal 104 is "3", i.e., the edges (level transitions) of the received data are synchronous to the third phase clock on an average. First, the data signal 101 is sampled and held over two periods by the F/Fs 301 and 302 in synchronism with the clocks 103-1 to 103-8 in the direction of time. Then, the third phase clock 103-3 is selected to be the first or reference phase clock on the basis of "3" indicated by the mean signal 104. The selectors 303-0 to 303-8 rotate the sampled data of the respective phases on the basis of the first phase clock. As a result, 2, 3, 4, 5, 6, 7, 8, 1 and 2 are sequentially output as selection output signal; the data sampled by the first phase clock 103-3 is the reference ("1" position).

The F/Fs 304 latch the above selection output signals in response to the separated clock 105 (first phase clock 103-3), thereby producing the sampled data 106-0 to 106-8. As a result, the data sampled by the separated clock 103-3 is the reference sampled data 106-1 to be output. By the above procedure, the data are sampled on the basis of the separated clock 105 in the direction of time.

FIGS. 7A-7M show the operation of the edge detecting circuit 4 to occur when the sampled data signals 106-0 to 106-8 and separated clock 105 are input thereto.

The first NAND gates 601 output "0" only at positions where a negative-going edge is present, and output "1" at the other positions. The second NAND gates 602 output "0" at positions where a positive-going edge is present, and output "1" at the other positions.

The coder 603 detects the position of "0 (phase number)" included in the outputs of the first NAND gates 601 and codes it. FIG. 8 shows a coding logic applicable to the coder 603. In FIG. 8, X is representative of "Don't Care", i.e., it may either be "0" or "1". The output signals or codes 107 of the coder 603 are represented by three bits, and each corresponds to a particular phase number.

The adders 605 and 606 respectively detect and add "0" included in the outputs of the first NAND gates 601 and "0" included in the outputs of the second NAND gates 602.

FIGS. 9A-9D demonstrate the operation of the negative-going edge counter 5 to occur when the negative-going edge position information 107 and separated clock 105 are input thereto. As shown, the information or signal 107 is weighted by ¼ by the ¼ weight section 701 and then added to the previous mean value (up to the last period) stored in the storage 702. As a result, a mean value of the weighted negative-going edge positions is produced. The mean value is rounded off to an integer and then output as the mean signal 104.

Why the edge position information is weighted by ¼ and then average is that the PLL circuit should adapt itself to sharp changes in mean value little by little.

The operation of the data identifying and retiming circuit 8, FIG. 5, is as follows. In FIG. 5, assume that the sampled data based on the separated clock 105 includes only negative-going edges, and the number of which is one (D1, D2)=(1, 0), as indicated by the signals representative of the numbers of edges. This is illustrated at the bottom of FIG. 10C, in which T is representative of one period of the data. In this case, s ("4") is selected with the result that the sampled data 180 degrees apart from the mean value of the negative-going edges is output. That is, the sampled data corresponding to the fourth phase clock, which is (360 degrees/8)×4=180 degrees apart from the first phase clock, is output.

Assume that the sampled data includes only positive-going edges, and the number of which is one (D1, D2)=(0,1), as indicated by the above signals. This is illustrated at the top of FIG. 10C. Then, t ("4") is selected with the result that the sampled data 180 degrees apart from the mean value of the negative-going edges is output.

Further, assume that the sampled data includes one negative-going edge and one positive-going edge (two edges). This is illustrated in FIG. 10B. In this case, the coder 802 detects the first edge of the data, and the sampled data corresponding to the phase number associated with the above edge is output.

Figure 10A:
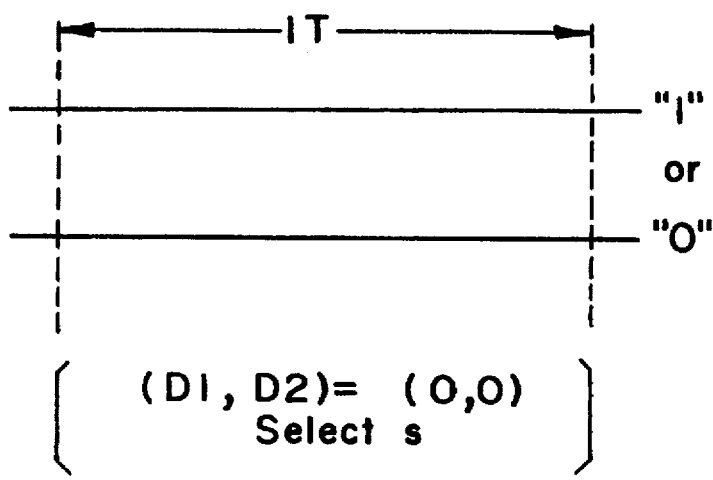
Figs. 10A–10C are timing charts representative of a specific operation of the data identifying and retiming circuit.
Figure 10B:
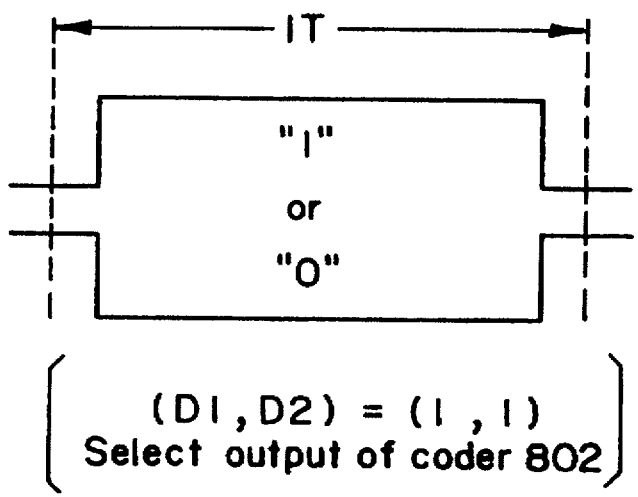
Figure 10C:
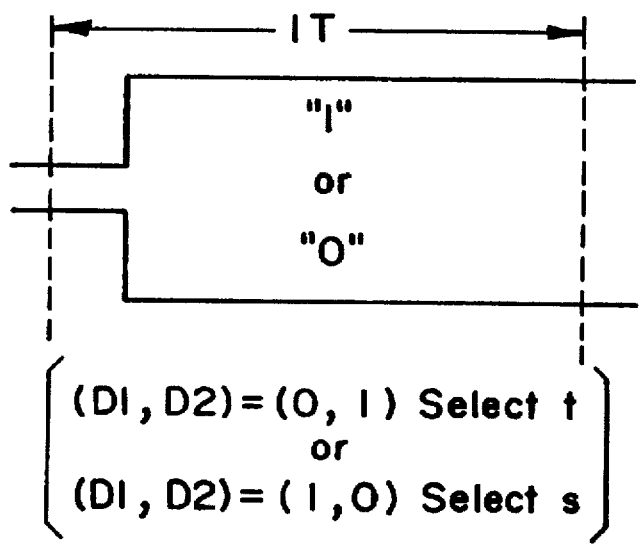

In addition, assume that the sampled data includes no edges, as illustrated in FIG. 10A, or that it includes three or more edges. Then, s ("4") (or t, if desired), is selected with the result that the sampled data of the intermediate phase (substantially 180 degrees) is output.

In the above produced, s and t are both "4" so as to select the sampled data of the phase corresponding to the center of 1T which is 180 degrees apart from the edge. This successfully produces a retimed output scarcely susceptible to jitter. If the negative-going and positive-going edges have the same jitter pattern, s and t may be both "4". However, s and t may be, e.g., "3" and "5" because the jitter pattern sometimes differ from the negative-going edge to the positive-going edge due to the arrangement of a communication system or each circuit included therein.

As stated above, the illustrative embodiment is capable of producing retimed data 112 free from misidentification at all times. The separated clock 105 can be produced on the terminal 10.

Figure 11:
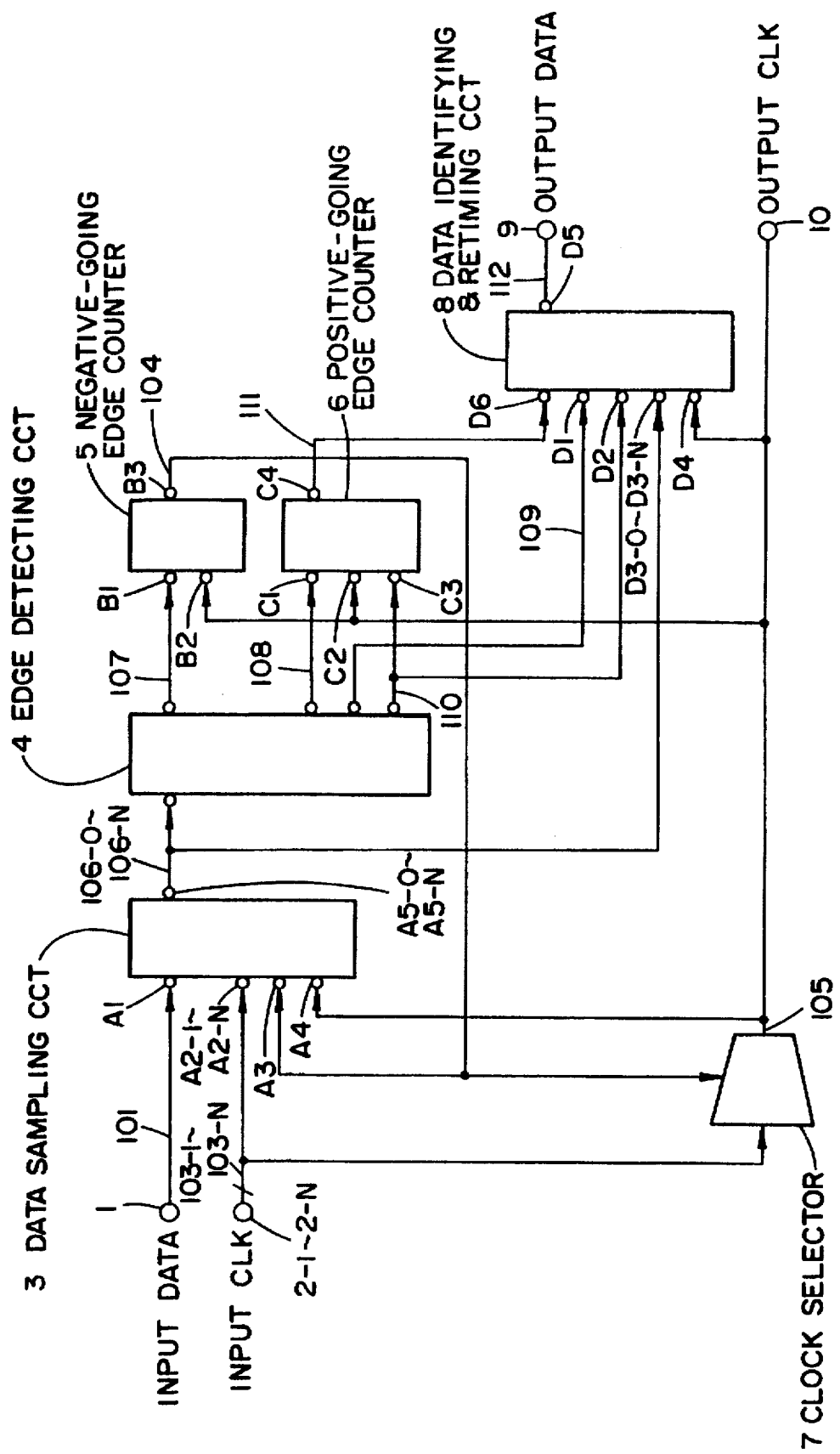
FIG. 11 is a block diagram showing a second embodiment of the present invention.
Figure 12:
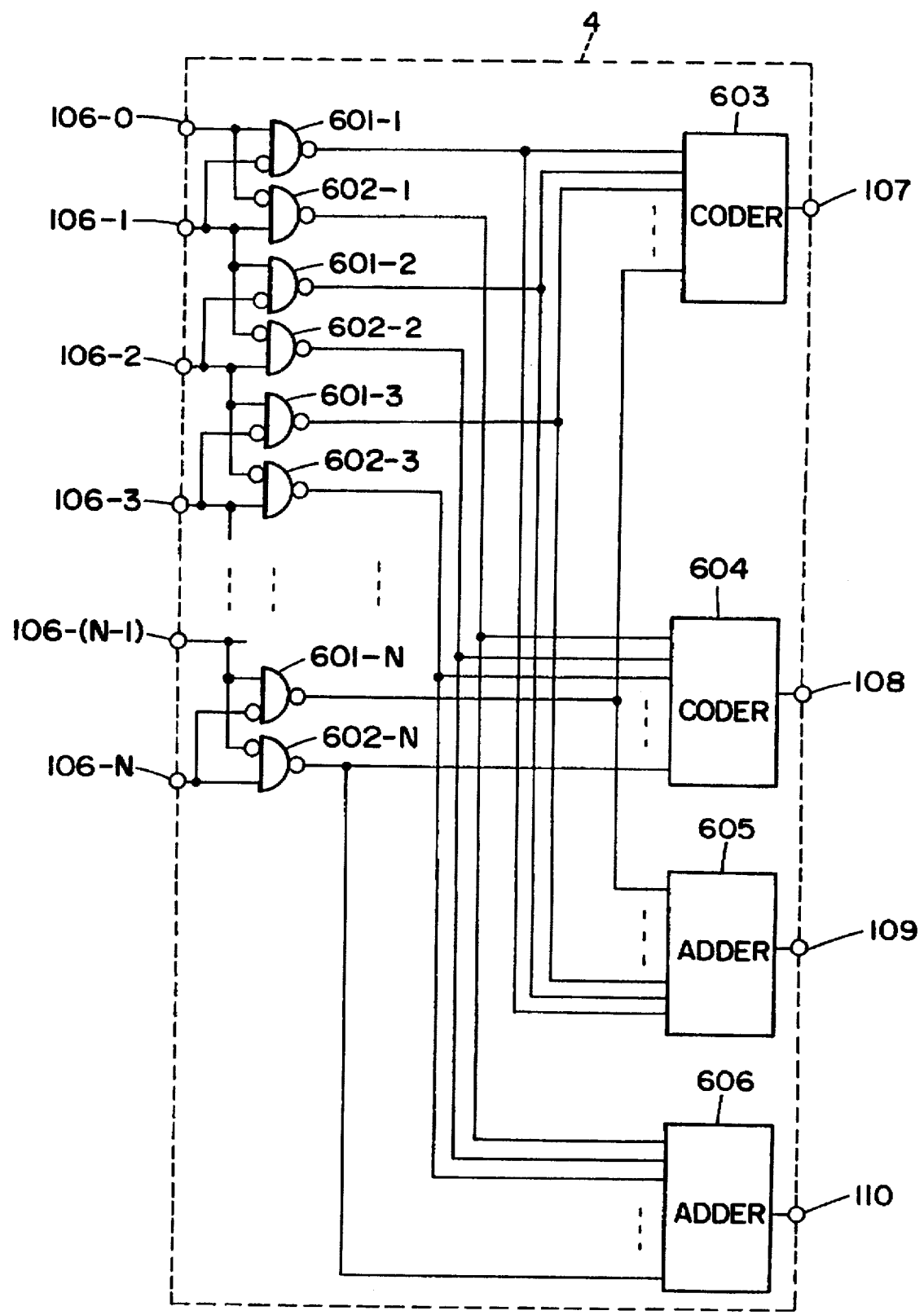
FIG. 12 shows a specific construction of the edge detecting circuit included in the second embodiment.

Referring to FIG. 11, an alternative embodiment of the present invention will be described. In FIG. 11, the same or similar constituents as or to the constituents of FIG. 1 are designated by the same reference numerals, and a detailed description thereof will not be made in order to avoid redundancy. As shown, the edge detecting circuit 4 additionally includes a coder 604 (see FIG. 12) for generating edge position information 108 representative of the positive-going edge positions. A positive edge counter 6 is additionally included in the circuitry of FIG. 11 in order to produce a mean value of the positive-going edge information 108.

Figure 13:
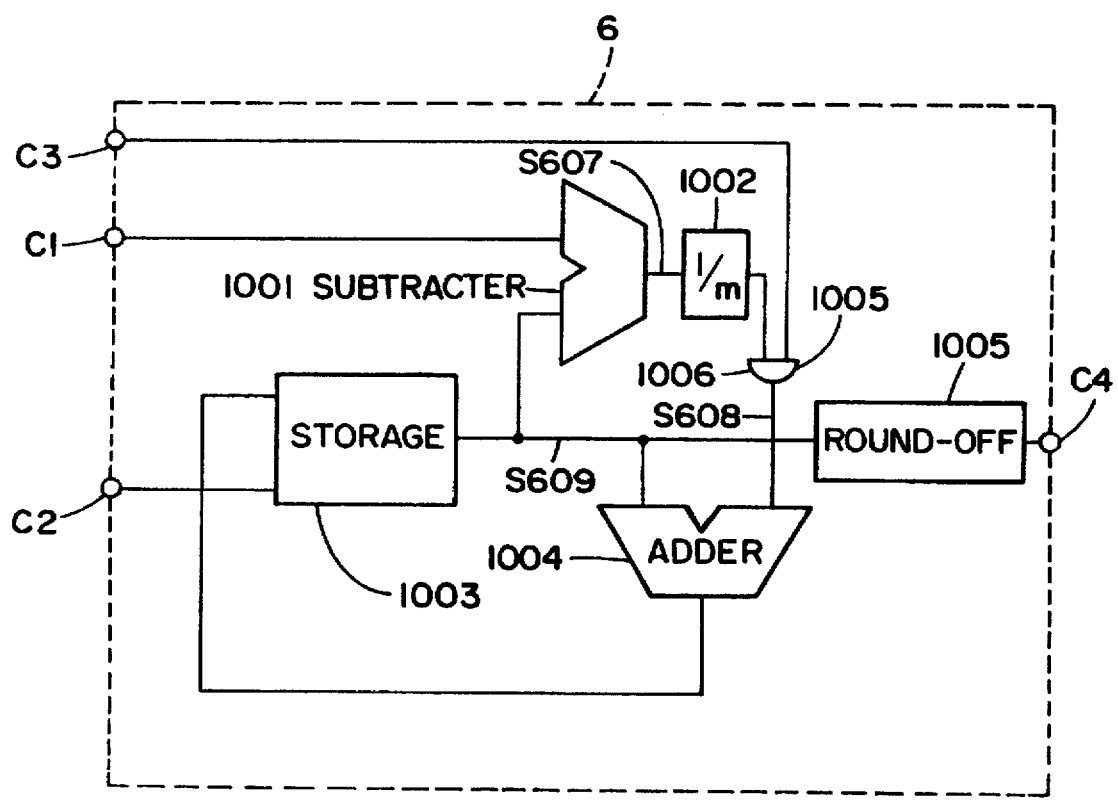
FIG. 13 shows a specific configuration of a positive-going edge counter included in the second embodiment.

FIG. 13 shows a specific configuration of the positive-going edge counter 6. As shown, the edge position information signal is input to one of the signal terminal of a subtracter 1001 via a terminal C1. A storage 1003, clocked by the separated clock signal input to a terminal C2, holds the output of an adder 1004 while delivering it to a round-off circuit 1005.

The subtracter 1001 subtracts the output of the storage 1003 from the edge position information signal input via the terminal C1, and feeds the result of subtraction to a 1/m weighting circuit 1002. The output of the weighting circuit 1002 is fed to an AND gate 1006. The AND gate ANDs the signal representative of the number of edges and input to a terminal C3 and the output of the weighting section 1002. The resulting AND is fed to the adder 1004.

The adder 1004 adds the output of the 1/m weighting section 1002 and the output of the storage 1003 and delivers the resulting corrected mean value to the storage 1003. A round-off circuit 1005 rounds the output of the storage 1003 to an integer and outputs it via a terminal C4 as an edge mean value signal 111.

Figure 14:
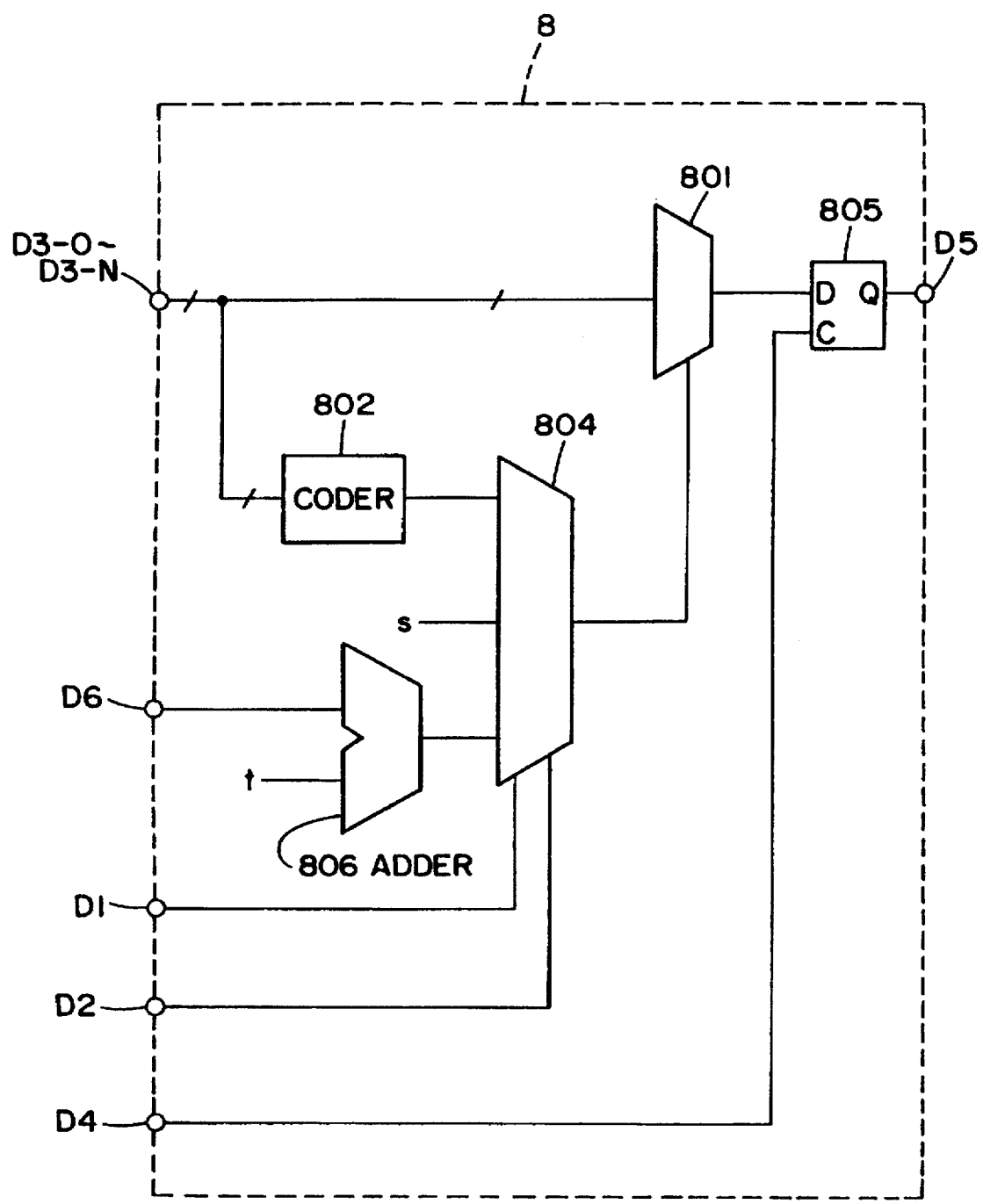
FIG. 14 is a timing chart demonstrating a specific operation of the data identifying and retiming circuit included in the second embodiment.

FIG. 14 shows a specific configuration of the data identifying and retiming signal 8. In FIG. 14, the same constituents as the constituents of FIG. 5 are designated by the same reference numerals. As shown, an adder 806 adds the value of t and the mean value 111 (D6) of the positive-going edge position information. When (D1,D2)=(0,1) (top of FIG. 10C), the output of the adder 806 is used.

Figure 15:
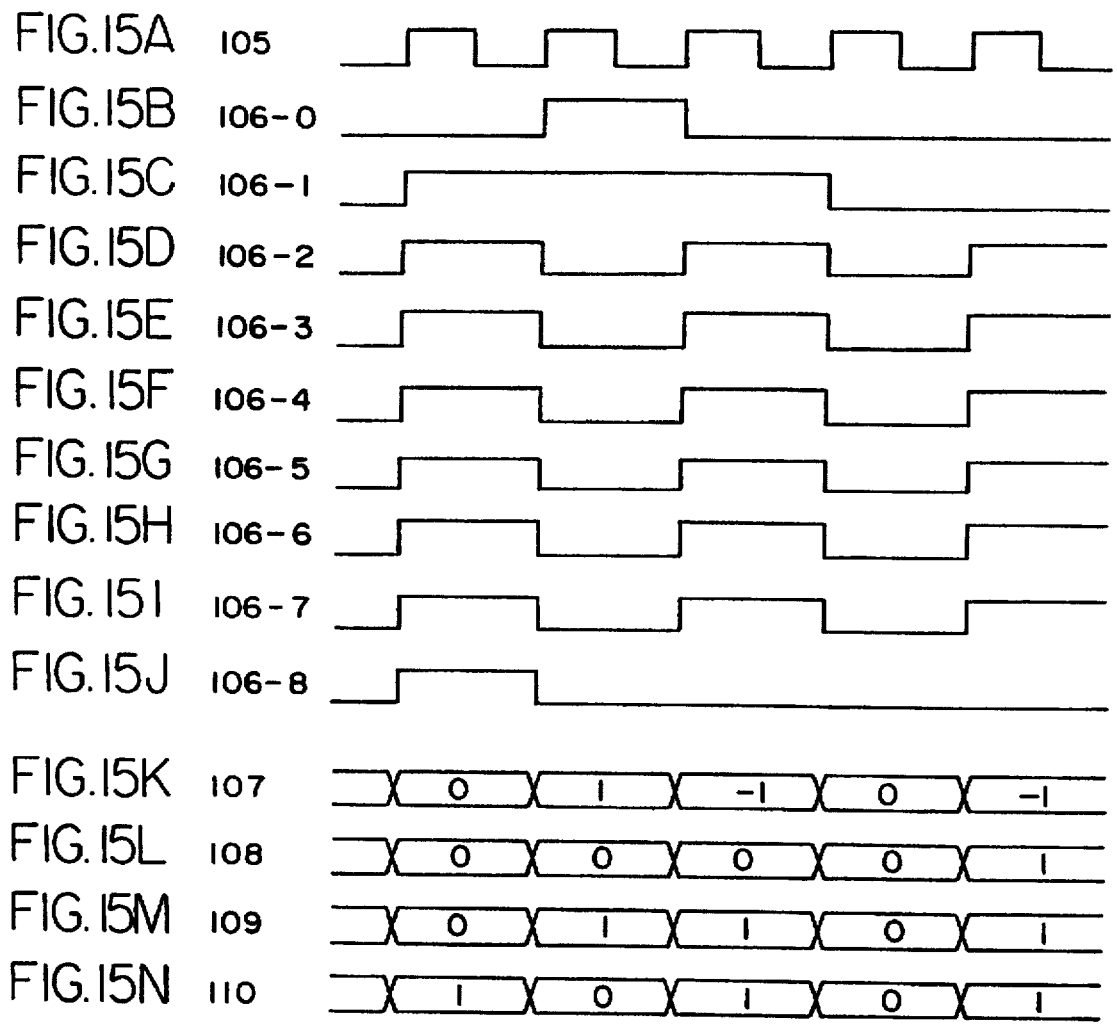
FIGS. 15A–15N are timing charts demonstrating a specific operation of the edge detecting circuit included in the second embodiment.
Figure 16:
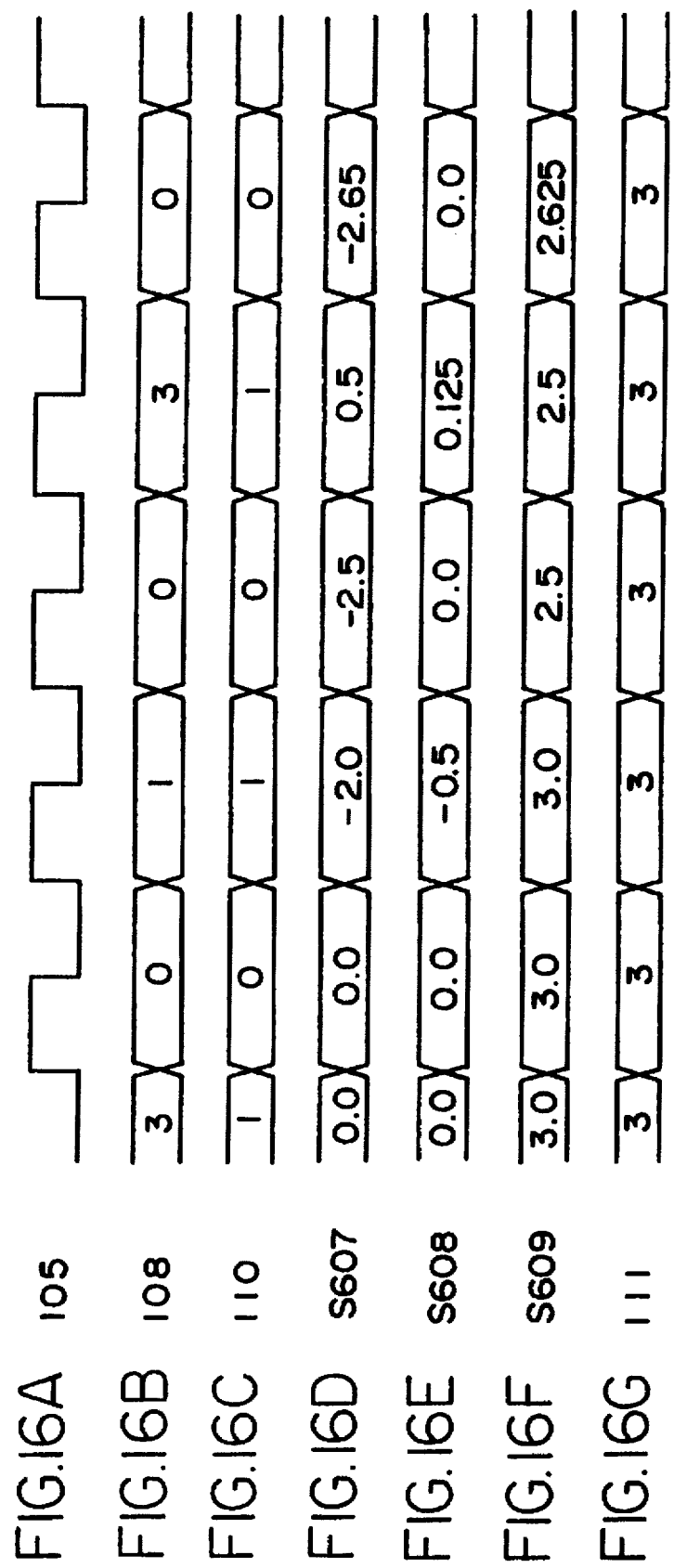
FIGS. 16A–16G timing chart demonstrating a specific operation of the positive-going edge counter included in the second embodiment.

FIGS. 15A–15N demonstrate the operation of the edge detecting circuit 4 to occur when the sampled data 106-0 to 106-8 and separated clock 105 are input thereto.

The first NAND gates 601 outputs "0" only at positions where a negative-going edge exists, and produces "1" at the other positions. The second NAND gates 602 produce "0" only at positions where a positive-going edge exists, and produces "1" at the other positions.

The coders 603 and 604 respectively detect the positions of "0" included in the outputs of the NAND gates 601 and 602 and code them. Again, use is made of the coding logic shown in FIG. 8.

The adders 605 and 606 respectively detect the numbers of "0" output from the NAND gates 601 and 602 and add them together.

FIGS. 16A–16G show the operation of the positive-going edge counter 6 to occur when the positive-going edge position signal 108 and the signal 110 representative of the number of positive-going edges are input thereto.

A difference between the positive-going edge position information 108 and the value held in the storage 1003 is produced. The difference is weighted by ¼. The weighted difference and the signal 110 representative of the number of positive-going edges are ANDed. Only when a positive-going edge is present, the adder 1004 adds the AND to the value held by the storage 1003. As a result, a mean value of the positive-going edge positions having their positions weighted is produced. The mean value is rounded off and the output as the positive-going edge mean value signal 111.

The operation of the data identifying and retiming circuit 8 shown in FIG. 14 is as follows. If the sampling data based on the separated clock 105 includes only negative-going edges, and the number of which is one, as indicated by the signals representative of the numbers of edges, y ("4") is selected. As a result, sampled data 180 degrees apart from the mean value of the negative-going edges is output.

If only the positive-going edges are present and if the number thereof is one, as indicated by the above signals, the sum of the positive-going edge mean value signal 111 and t ("4") is selected. Consequently, sampled data 180 degrees apart from the mean value of the positive-going edges is output.

Further, if one negative-going edge and one-positive going edge (two edges) are present, the coder 802 detects the first edge position of the data and outputs the sampled data corresponding thereto.

Moreover, if no edges are present or if three or more edges are present, s ("4") is selected with the result that the intermediate sampled data is output. This successfully outputs the retimed data 112 free from identification errors.

Figure 17:
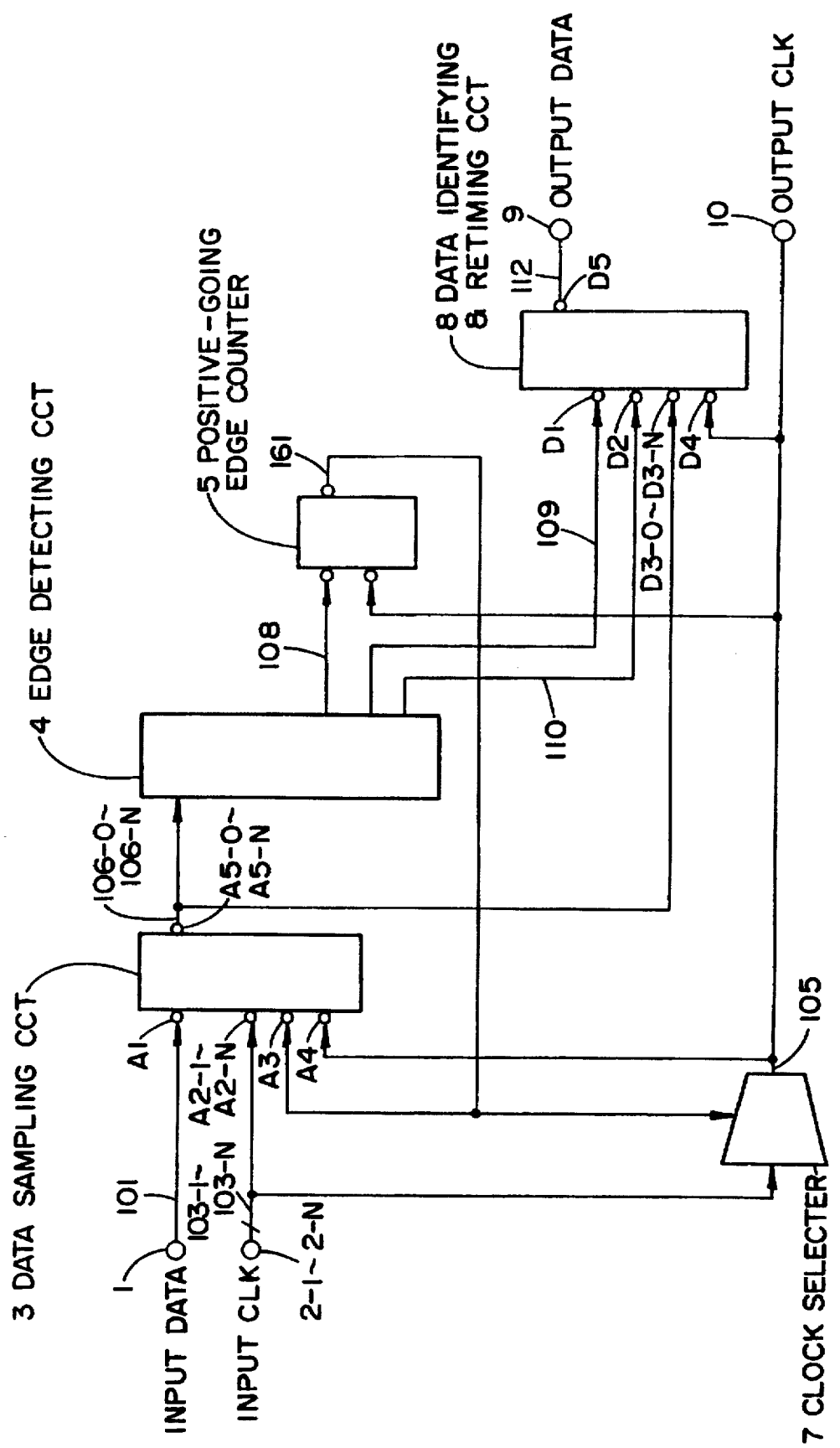
FIGS. 17 and 18 are schematic block diagrams respectively showing a third and a fourth embodiment of the present invention.

FIG. 17 shows another alternative embodiment of the present invention. This embodiment is similar to the embodiment shown in FIG. 1 except that the phase of the separated clock is selected on the basis of the mean value of the positive-going edge positions in place of the mean value of the negative-going edge positions.

Figure 18:
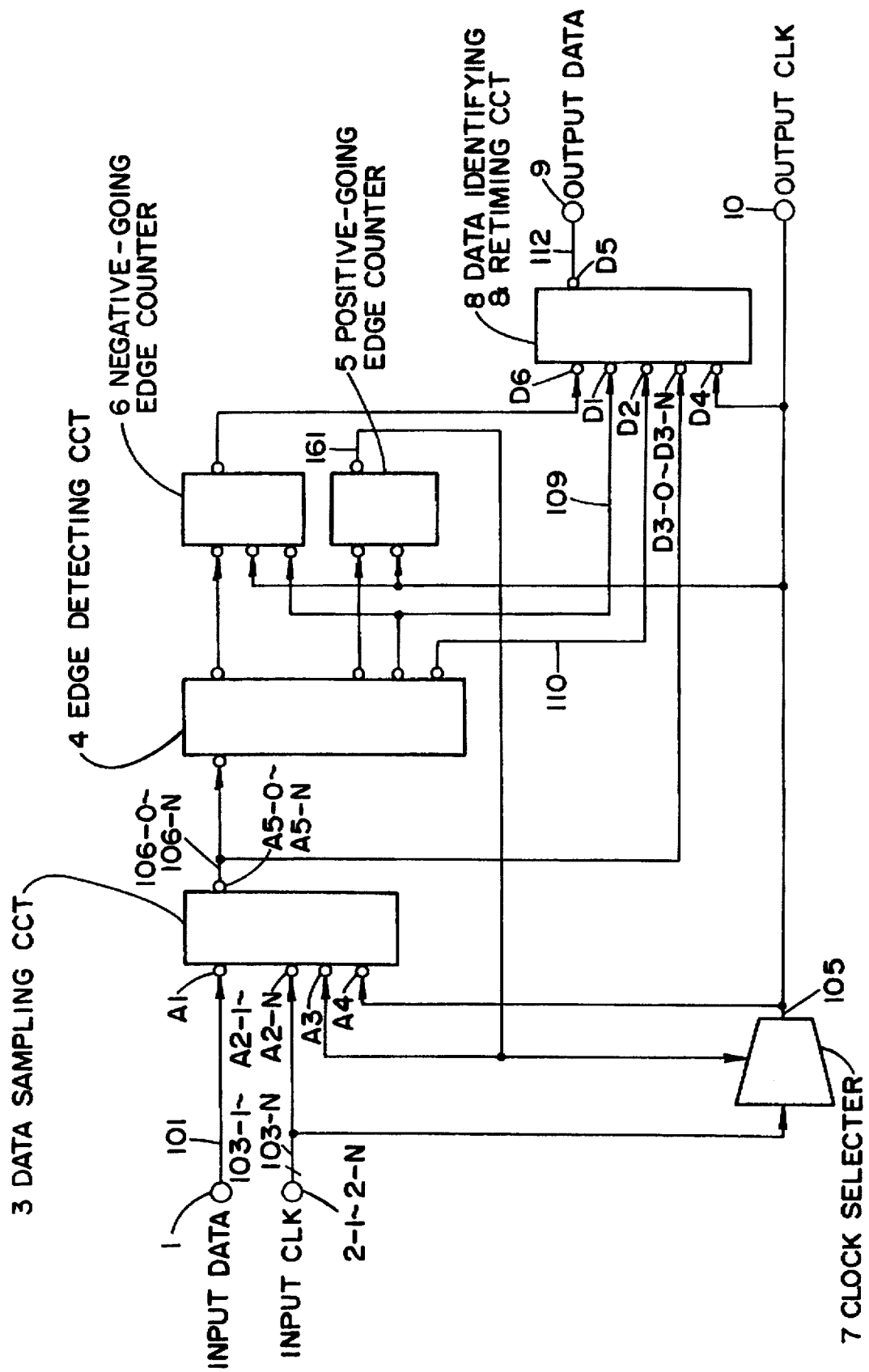

FIG. 18 shows a further alternative embodiment of the present invention. As shown, this embodiment is similar to the embodiment shown in FIG. 11 except that use is made of the mean value of the positive-going edge positions in place of the mean value of the negative-going edge positions.

What is claimed is:

1. A digital PLL circuit comprising:
    sampling means for sampling a burst data signal in synchronism with N phase clocks to thereby output N phase sampled data signals;
    rearranging means for rearranging the N phase sampled data signals in synchronism with a reference signal to thereby generate N phase rearranged data signals;
    select signal generating means for generating a select signal;
    selecting means for selecting, in response to said select signal, an optimal sampled data signal out of said N phase rearranged signals; and
    retiming means for retiming said sampled data signal selected in synchronism with said reference signal.

2. A digital PLL circuit as claimed in claim 1, wherein said selected signal generating means identifies the burst data signal on the basis of said N phase rearranged data signals, and generates said select signal in response to a result of identification.

3. A digital PLL circuit comprising:
    clock selecting means for selecting one of N phase clocks, which are identical in frequency with a burst data signal and sequentially shifted in phase by 360 degrees/N (N being 2 or greater integer), at a time in response to a select signal indicative of which of the N phase clocks should be selected:
    sampling means for sampling the burst data signal in response to said N phase clocks to thereby generate N sampled data:
    rearranging means for rearranging, by using the clock indicated by said select signal as a reference first phase clock and using the successive clocks' as a second phase-clock to an N-th phase clock, the N sampled data in response to said first phase clock to said N-th clock to thereby output a first phase sampled data to an N-th phase sampled data;
    latching means for latching said first sampled data to said N-th sampled data in response to said reference first phase clock separated;
    edge detecting means for detecting, based on levels of nearby phases output from said latching means, a position of the phase where a negative-going edge exists to thereby generate negative-going edge position information every period of said clock, and for detecting a number of negative-going edges and a number of positive-going edges to thereby generate negative-going edge number information and positive-going edge number information every period of said clock;

calculating means for calculating a mean value of said negative-going edge position information from the past to the present every period to thereby output said select signal;

data selecting means for selecting one of said first phase sampled data to said N-th phase sampled data at a time every period on the basis of said first phase sampled data to said N-th phase sampled data and said negative-going edge number information and said positive-going edge number information; and retiming means for retiming outputs of said data selecting means in synchronism with said first phase clock.

4. A digital PLL circuit as claimed in claim 3, wherein said data selecting means comprises:

means for detecting a phase of, among said first phase sampled data to said N-th phase sampled data, the sampled data in which an edge occurs first within one period; and a selector for selecting, when said negative-going edge number information and said positive-going edge number information are both representative of 0 (zero) or when only said negative-going edge number information or only said positive-going edge number information is representative of 1 (one), the sampled data corresponding to the phase clock shifted substantially 180 degrees in phase relative to said reference first clock, or selecting, when said negative-going edge number information and said positive-going edge number information are both representative of 1, the sampled data in which an edge has been detected first within the one period.

5. A digital PLL circuit as claimed in claim 4, wherein said edge detecting means detects, bases on the levels of the nearby phases output from said latching means, the position of the phase where the positive-going edge exists to thereby generate said positive-going edge position information every period of said clock, wherein said calculating means calculates the mean value every period, and wherein said data selecting means selects, when said positive-going edge number information is representative of 1, the sampled data corresponding to the phase clock shifted 180 degrees in phase relative to the phase clock corresponding to the mean value of the positive-going edge position information.

6. A digital PLL circuit as claimed in claim 3, wherein said negative-going edge position information is replaced with positive-going edge position information representative of positive-going edges, and wherein said positive-going edge position information is replaced with negative-going edge position information representative of negative-going edges.

* * * * *